United States Patent [19]

Ovshinsky et al.

[11] 4,409,605

[45] Oct. 11, 1983

[54] AMORPHOUS SEMICONDUCTORS EQUIVALENT TO CRYSTALLINE SEMICONDUCTORS

[75] Inventors: Stanford R. Ovshinsky, Bloomfield Hills; Arun Madan, Birmingham, both of Mich.

[73] Assignee: Energy Conversion Devices, Inc., Troy, Mich.

[21] Appl. No.: 427,688

[22] Filed: Sep. 29, 1982

Related U.S. Application Data

[60] Continuation of Ser. No. 222,489, Jan. 5, 1981, abandoned, which is a continuation-in-part of Ser. No. 104,284, Dec. 17, 1979, abandoned, which is a division of Ser. No. 887,353, Mar. 16, 1978, Pat. No. 4,226,898.

[51] Int. Cl.³ ............................................. H01L 45/00
[52] U.S. Cl. .......................................... 357/2; 357/59; 357/15; 357/16; 357/30; 357/63
[58] Field of Search .................... 357/2, 63, 15, 16, 30, 357/59

[56] References Cited

U.S. PATENT DOCUMENTS 4,064,321  12/1977  Carlson ................................. 357/2
4,196,438   4/1980  Carlson ................................ 357/15

OTHER PUBLICATIONS

Nielsen, *Appl. Phys. Lett.* 37(12) 15 Dec. 1980, pp. 1090–1092.
Madan et al, *Philosphical Magazine*, vol. 40, No. 4 1979, pp. 259–277.
Adler et al, *J. Appl. Phys.*, 51(12), Dec. 1980, pp. 6429–6431.
Tsu et al, *Solid State Comm.*, 1980 Jun. 1980, pp. 1–15.
Murphy, *Foundations of College Chemistry*, pp. 575–576 2nd Edition, Ronald Press Co. N.Y., N.Y.
Carlson Recent Developements In Amorphous Silicon Solar Cells, *Solar Energy Materials* 3, (1980), pp. 503–518.
Carlson, *Journ. of Non-Crystalline Solids*, 35 & 36 (1980), pp. 707–717.
Matsumura, Preparation and Properties of Fluorinated Amorphous Silicon *Amorphous Semiconductor Technologies and Devices*, pp. 88–108, 1982.

*Primary Examiner*—Martin H. Edlow
*Attorney, Agent, or Firm*—Lawrence G. Norris

[57] ABSTRACT

An amorphous semiconductor body, most advantageously a glow discharge deposited silicon-containing host matrix film, is provided containing at least fluorine as a compensating or altering agent, and most preferably at least one complementary compensating or altering agent, such as hydrogen, both of which reduce the localized defect states in the energy gap of the amorphous semiconductor material to a degree which either one alone could not achieve. The silicon and/or other elements of the host matrix film are deposited by the glow discharge decomposition of gaseous compounds preferably with fluorine as one element of a compound, the hydrogen and other compensating and altering material being preferably a molecular gas or an element of a compound of silicon or other host matrix element.

39 Claims, 16 Drawing Figures

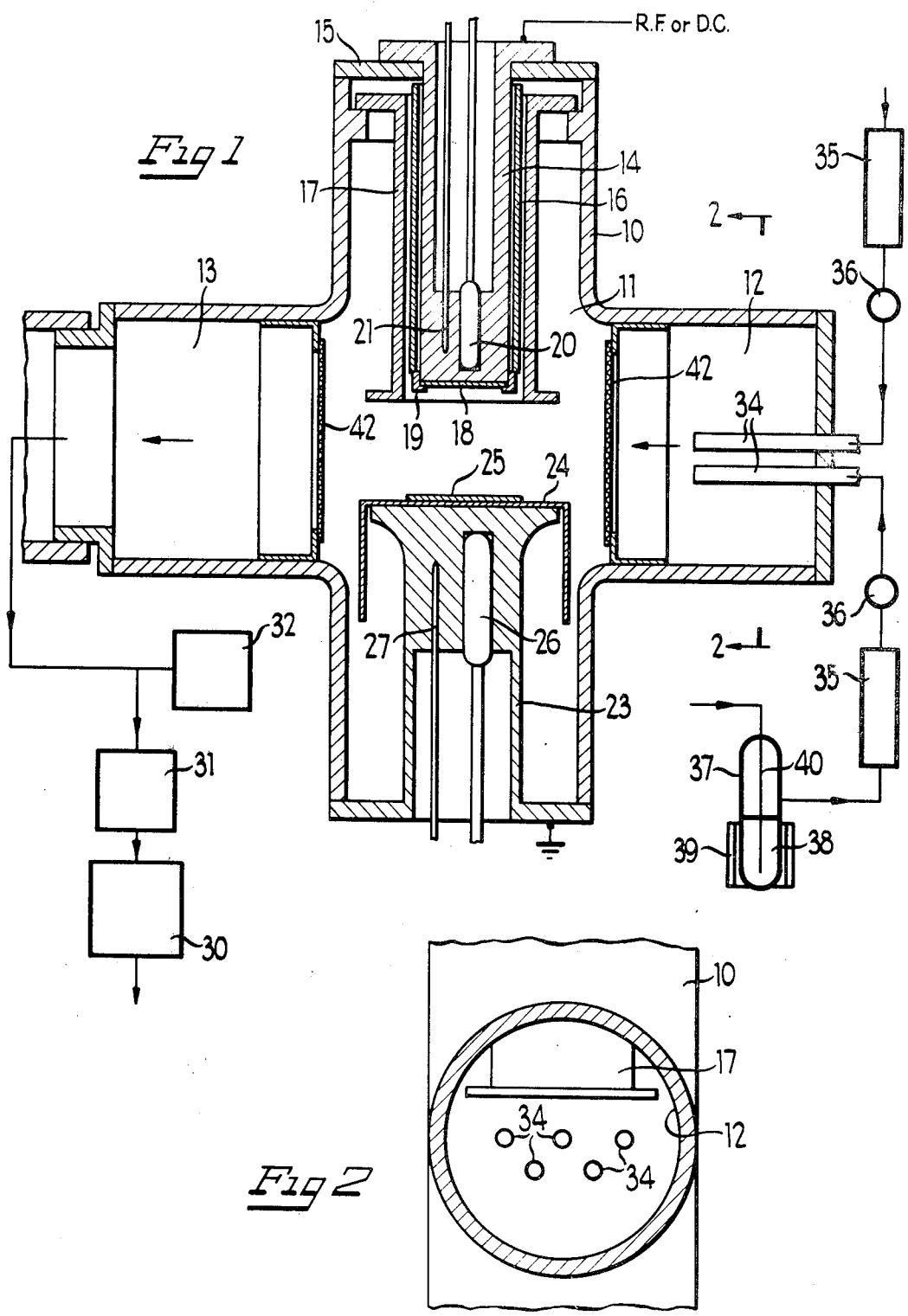

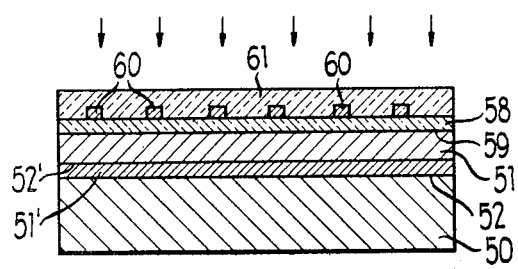
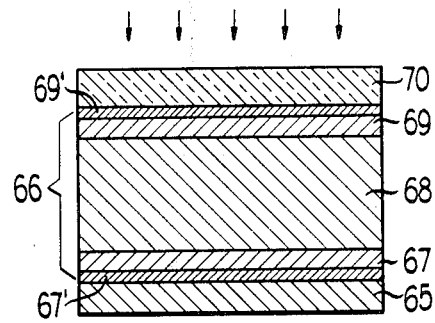
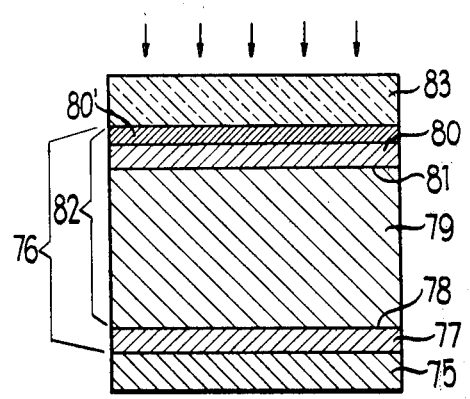
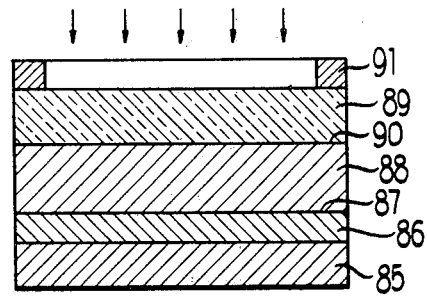
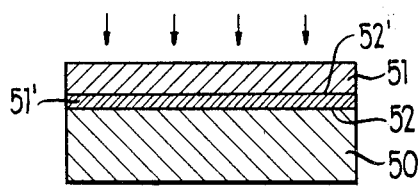
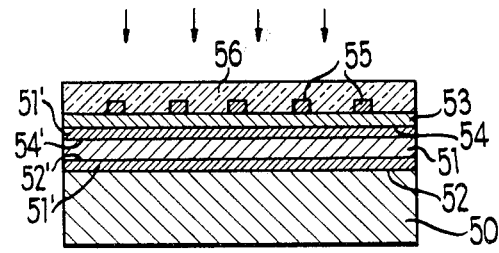

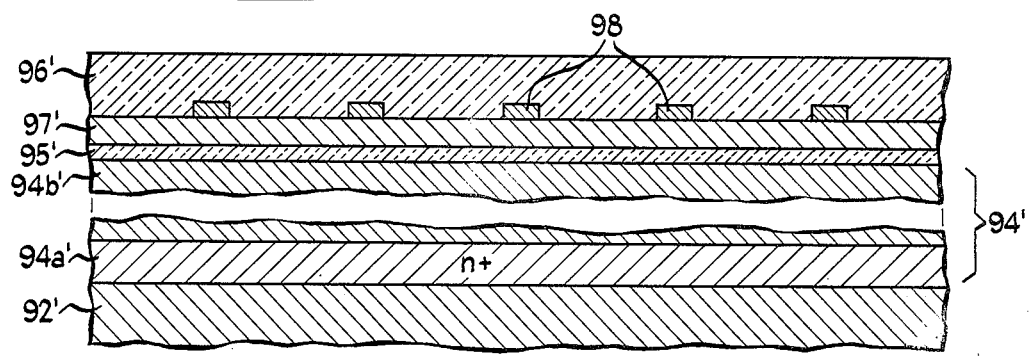
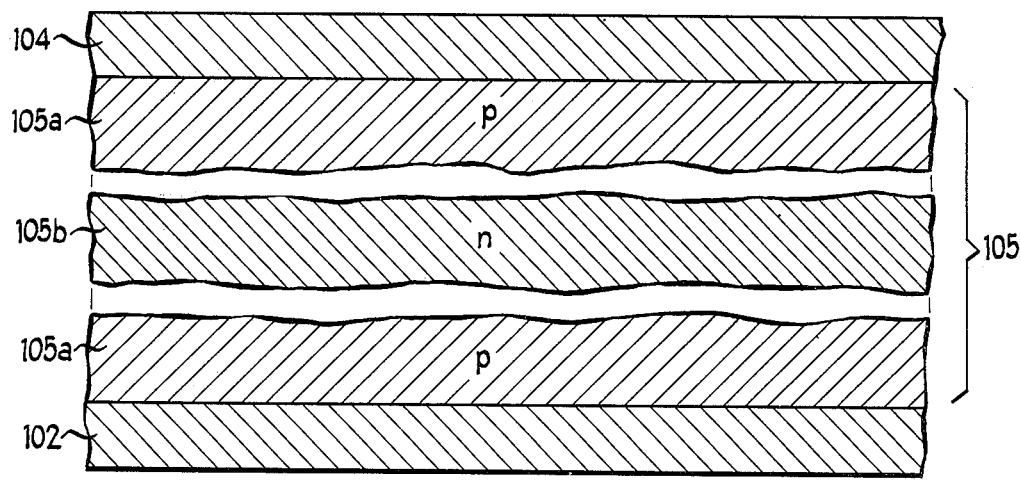

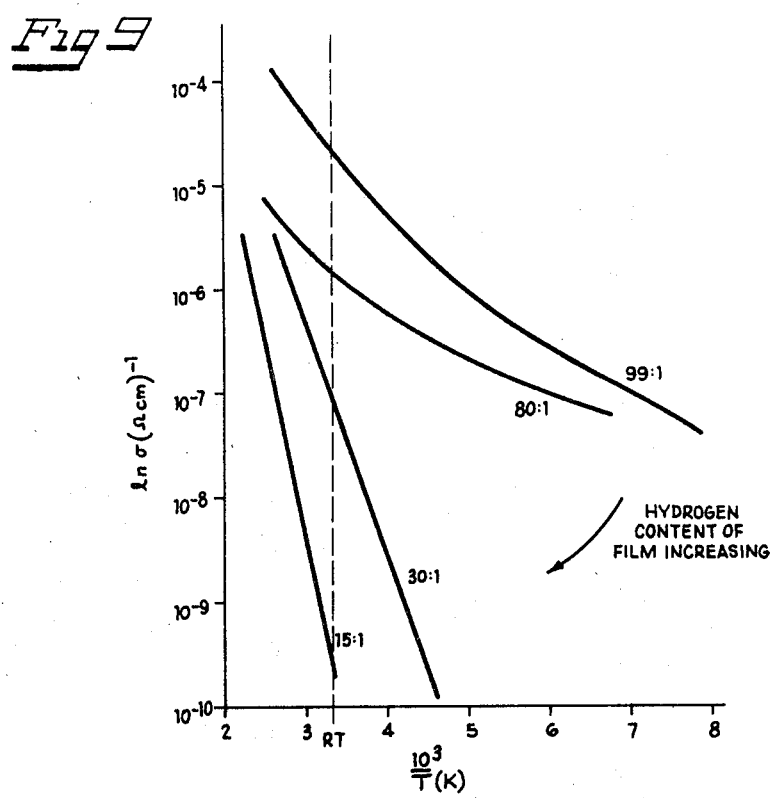
Fig 9
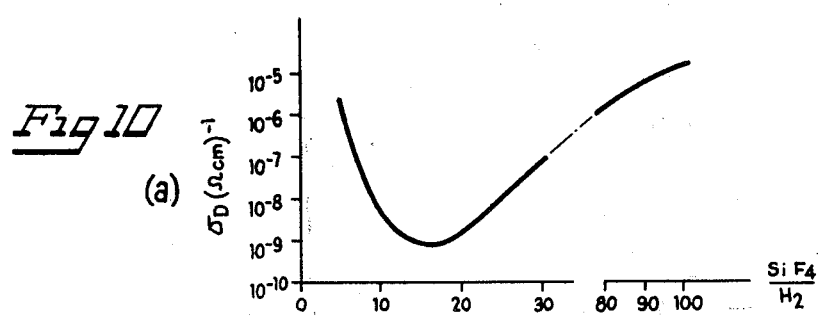
Fig 10 (a)
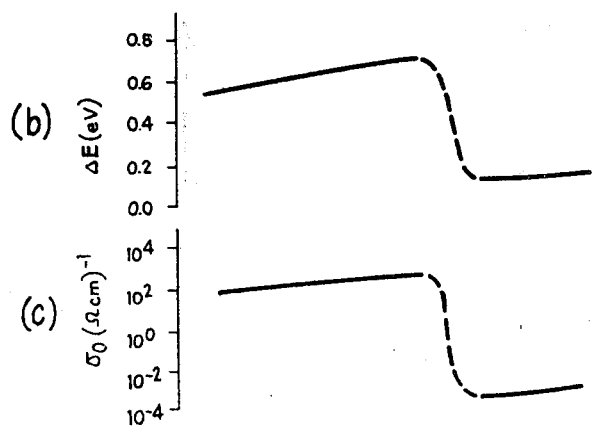
(b)
(c)

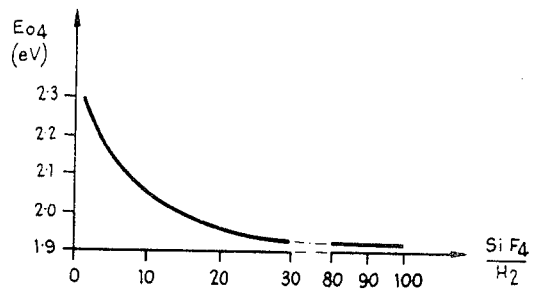
Fig 11
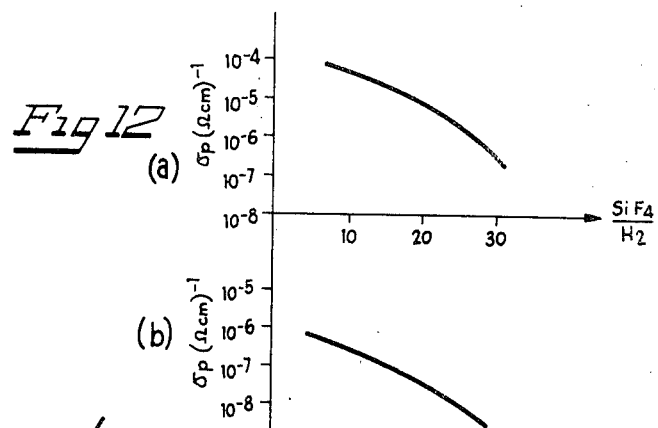
Fig 12
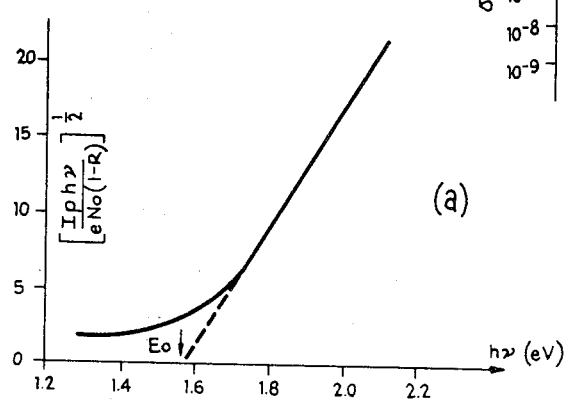
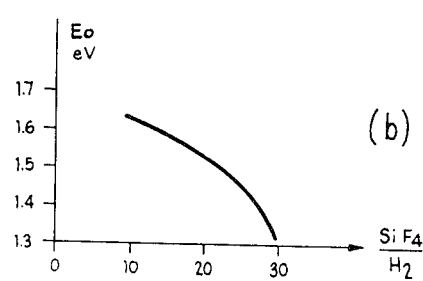
Fig 13

AMORPHOUS SEMICONDUCTORS EQUIVALENT TO CRYSTALLINE SEMICONDUCTORS

RELATED APPLICATIONS

This application is a continuation of U.S. application Ser. No. 222,489, filed Jan. 5, 1981 and now abandoned which application in turn is a continuation-in-part of U.S. application Ser. No. 104,284, filed Dec. 17, 1979 and now abandoned, which application, in turn, is a division of U.S. Serial No. 887,353, filed 3/16/78, U.S. Pat. No. 4,226,898, granted Oct. 7, 1980.

BACKGROUND OF THE INVENTION

The invention relates to amorphous semiconductor bodies with uniquely low defect states in the energy gap, such as dangling bonds, recombination centers, etc., to provide improved amorphous semiconductor films which have characteristics like those found in corresponding crystalline semiconductors. (By the term "amorphous" is meant a material which has long range disorder, although it may have an ordered structure in the short or intermediate range order, or it may contain isolated domains having an ordered structure in a primarily amorphous matrix.) The amorphous films involved have one of their most important applications in photovoltaic devices, and current control devices, such as various p-n junction devices such as p-i-n and m-i-s, devices, rectifiers, transistors or the like, where heretofore crystalline semiconductor bodies have been used in their fabrication.

The principles involved in the invention have their most important and useful application to amorphous silicon and siliconalloy bodies, especially thin films of such materials, although many aspects thereof are also applicable to various other similar amorphous semiconductor bodies, and formed by elements including individual elements or mixtures or alloys of elements which have localized defect states in the energy gap which adversely affect certain desired electrical characteristics thereof.

Amorphous silicon-containing films, if made equivalent to crystalline silicon films, would have many advantages over such crystalline silicon films (e.g. lower cost, larger area, easier and faster manufacture). The main purpose of this invention is to provide amorphous semiconductor bodies which have characteristics resembling those of corresponding crystalline materials.

When crystalline semiconductor technology reached a commercial state, it became the foundation of the present huge semiconductor device manufacturing industry. This was due to the ability of the scientist to grow substantially defect-free germanium and particularly silicon crystals, and then turn them into extrinsic materials with p-type and n-type conductivity regions therein. This was accomplished by diffusing into such crystalline material parts per million of donor (n) or acceptor (p) dopant materials introduced as substitutional impurities into the substantially pure crystalline materials, to increase their electrical conductivity and to control their being either of a p or n conduction type. The fabrication processes for, making p-n junction crystals involve extremely complex, time consuming, and expensive procedures. Thus, these crystalline materials useful in solar cells and current control devices are produced under very carefully controlled conditions by growing individual single silicon or germanium crystals, and when p-n junctions are required, by doping such single crystals with extremely small and critical amounts of dopants.

These crystal growing processes produce such relatively small crystals that solar cells require the assembly of many single crystals to encompass the desired area of only a single solar cell panel. The amount of energy necessary to make a solar cell in this process, the limitation caused by the size limitations of the silicon crystal, and the necessity to cut up and assemble such a crystalline material have all resulted in an impossible economic barrier to the large scale use of crystalline semiconductor solar cells for energy conversion. Further, crystalline silicon has an indirect optical edge which results in poor light absorption in the material. Because of the poor light absorption, crystalline solar cells have to be at least 50 microns thick to absorb the incident sunlight. Even if the single crystal material is replaced by polycrystalline silicon with cheaper production processes, the indirect optical edge is still maintained; hence the material thickness is not reduced. The polycrystalline material also involves the addition of grain boundaries and other problem defects.

An additional shortcoming of the crystalline material, for solar applications, is that the crystalline silicon band gap of about 1.5 eV. The admixture of germanium, while possible, further narrows the band gap which further decreases the solar conversion efficiency.

In summary, crystal silicon devices have fixed parameters which are not variable as desired, require large amounts of material, are only producible in relatively small areas and are expensive and time consuming to produce. Devices manufactured with amorphous silicon can eliminate these crystal silicon disadvantages. Amorphous silicon has an optical absorption edge having properties similar to a direct gap semiconductor and only a material thickness of one micron or less is necessary to absorb the same amount of sunlight as the 50 micron thick crystalline silicon. Further, amorphous silicon can be made faster, easier and in larger areas than can crystal silicon.

Accordingly, a considerable effort has been made to develop processes for readily depositing amorphous semiconductor alloys or films, each of which can encompass relatively large areas, if desired, limited only by the size of the deposition equipment, and which could be readily doped to form p-type and n-type materials where p-n junction devices are to be made therefrom equivalent to those produced by their crystalline counterparts. For many years such work was substantially unproductive.

W. E. Spear and P. G. Le Comber of Carnegie Laboratory of Physics, University of Dundee, in Dundee, Scotland, did some work "Substitutional Doping of Amorphous Silicon", as reported in a paper published in Solid State Communications, Vol. 17, pp. 1193–1196, 1975. As there reported an amorphous silicon film was formed by glow discharge deposition of silane ($SiH_4$) gas in the presence of a doping gas of phosphine ($PH_3$) for a n-type conduction or a gas of diborane ($B_6H_6$) for p-type conduction. These gases were premixed and passed through a reaction tube where the gaseous mixture was decomposed by an r.f. glow discharge and deposited on a substrate at a high substrate temperature of about 350°–600° K. The material so deposited on the substrate was an amorphous silicon host matrix material where the phosphorous or boron formed dopants in the silicon host matrix material in concentrations between about $5 \times 10^{-6}$ and $10^{-2}$ parts per volume. When the localized defect states in the energy gap of the undoped form of these materials were measured it was found that the density of localized defect states in the energy gap thereof was substantially reduced from that previously measured for other amorphous silicon films deposited by other processes. However, a much more substantial reduction in the minimum density of these localized defect states was necessary to bring the electrical characteristics of amorphous silicon materials much closer to those of corresponding crystalline materials.

It is believed that it was not originally known by these researchers that the silicon films they deposited were, instead of relatively pure amorphous silicon films, a composition of silicon and hydrogen and that the hydrogen combined with the silicon, to eliminate many of the localized defect states. However, after this initial development of the glow discharge deposition of silicon from silane gas was carried out, work was done by others on the sputter depositing of amorphous silicon films in an atmosphere of mixture or argon (required by the sputtering deposition process) and molecular hydrogen, to determine the results of such molecular hydrogen on the characteristics of the deposited amorphous silicon film. This research indicated that the hydrogen acted as a compensating agent to reduce the localized defect states of the energy gap. However, the degree of reduction in the density of localized defect states achieved by this sputter deposition process was less than that achieved by the silane deposition process described above (as would be expected since sputter and evaporation deposition processes inherently produce amorphous films with much higher densities of localized states than does a glow discharge deposition process). This is the reason that it was not believed that sputter or evaporation deposition processes could successfully produce amorphous semiconductor films functionally equivalent to similar crystalline materials used in solar cell and current control devices. Also, the sputtering process must be carried out under certain critical partial pressure limitations, and since such partial pressures are effected both by the amount of argon and hydrogen gas present, the amount of molecular hydrogen gas which could be introduced into the sputtering atmosphere was accordingly limited.

The amount of a compensating material like hydrogen theoretically needed to eliminate the dangling bonds in amorphous semiconductor materials is only a small portion of one atomic percent thereof. Subsequently, it was determined that hydrogen compensated some of the dangling bonds of amorphous silicon materials, but the atomic percentage of hydrogen which combined with the silicon was found to be in alloying percentages, which are amounts at least about 1 to 5 percent. Whether such alloying amounts of hydrogen was beneficial or not to the amorphous silicon composition, to our knowledge, has not been commented upon in the published literature or otherwise.

The difficulty encountered heretofore in reducing the density of localized defect states in the energy gap of amorphous semiconductor materials like silicon and others to desirably low levels, so that these materials are more nearly equivalent of corresponding crystalline materials, is believed to be explainable in the following manner. At or near the Fermi level of these materials deposited, for example, by the glow discharge of silane, are two bumps of relatively high density states in the energy gap which are apparently related to the remaining dangling bond density. They are located substantially at about 0.4 eV below the conduction band $E_c$ and above the valence band $E_v$. When the glow discharge amorphous silicon is doped with phosphorus or boron, the Fermi level is believed to be moved up or down, but the density of localized states was so high that the dopant could not move the Fermi level close enough to the conduction or valence bands to have an effective p or n junction. Thus, the activation energy for the doped glow discharge amorphous silicon was not lowered below about 0.2 eV. This result also placed a theoretical limitation on the open-circuit photovoltage of a p-n junction of a doped glow discharge amorphous silicon, since the internal field cannot exceed the separation of the Fermi level in the p and n type regions. In addition, the remaining activation energy limits the room-temperature DC conduction of the doped glow discharge amorphous silicon and the material would have a large sheet resistance if it were made into a large area array, the resistance not being helped by the rather low carrier mobility which is a factor of about $10^4$–$10^5$ less than that for crystalline silicon. Also, where it is desirable to dope an amorphous silicon film to form an effective ohmic interface, for example, between an intrinsic (undoped) portion thereof and an outer metal electrode, such doped portions of the film must have a very high conductivity. The prior methods of doping such films which do not provide as useful an ohmic interface as in the case of the films of the invention to be described.

The silane glow discharge deposition of silicon films has some limitations in addition to the less than ideal reduction of the density of localized defect states in the energy gap achieved thereby. For example, such a process requires silane, which is a relatively expensive starting material. Also, the structure of such a film and electrical characteristics can vary with the amount of photon absorption therein, and the film is soft and easily scratched or otherwise physically damaged.

The present invention provides an amorphous semiconductor material, like silicon, with a much lower minimum density of localized defect states than was heretofore obtained, to provide more efficient photoconductive and photovoltaic devices. Thus, by providing a much lower density of defect states, the present invention increases carrier lifetime and depletion layer thickness. Also, it enables the amorphous silicon and other materials to be more efficiently doped by the addition of dopant materials thereto.

There has recently issued U.S. Pat. No. 4,196,438 to D. E. Carlson. This patent appears to have as its objective the making of amorphous silicon bodies by glow discharge in a gas atmosphere much less expensive than silane. The patent states that this less expensive gas includes the elements silicon and a halogen selected from the group consisting of chlorine, bromine and iodine. Examples of the deposition gas given are dichlorosilane ($SiH_2Cl_2$), chlorosilane ($SiH_3Cl$), trichlorosilane ($SiHCl_3$), bromosilane ($SiH_3Br$), dibromosilane ($SiH_2Br_2$) and silicon tetrachloride ($SiCl_4$) with particular emphasis placed on dischlorosilane. Notably and importantly, no reference is made to fluorine. While a comparison is made in this patent between the characteristics of the amorphous silicon devices disclosed therein and the prior sputtered amorphous silicon devices, just as comparisons are made in the prior Carlson U.S. Pat. No. 4,064,521 between the prior amorphous silicon devices fabricated by glow discharge in silane and amorphous silicon devices fabricated by sputtering, there is no reference in U.S. Pat. No. 4,196,438 to any reduced density of localized defect states over that achieved by the use of silane, as is achieved by the present invention. The reduction of this crucial parameter is one of the most important contributions of the present invention.

DESCRIPTION OF THE INVENTION

The present invention has to do with the formation of a glow discharge deposited amorphous semiconductor body, preferably a silicon-containing film, containing at least fluorine as a compensating or altering agent, and most preferably at least one complementary compensating or altering agent such as hydrogen, both of which reduce the localized defect states in the energy gap of the amorphous semiconductor material to a degree which either one alone could not achieve. (The term "compensating or altering agent" refers to a material which eliminates dangling bonds and the like. An altering agent is a compensating material which may combine with the host matrix in amounts sufficient to form an alloy with the host matrix). As a result, the amorphous semiconductor body provides a higher photoconductivity, wider depletion width, more efficient charge carrier collection, longer carrier lifetime, and lower dark intrisic electrical conductivity, where desired, and can be more easily doped to shift the Fermi level to provide very efficient n-type extrisic electrical conductivity and the like than prior amorphous semiconductor bodies.

While the broader aspects of the invention are not to be so limited, it is believed desirable that the process condition used to introduce the fluorine and other compensating materials into the amorphous semiconductive body are such as to chemically bond therewith in alloying amounts which is believed further to lower the density of localized defect states in the energy gap. Such process conditions exist inherently in the exemplary process conditions described in said U.S. Pat. No. 4,226,898 and to be described below. Thus, there is formed an alloy of silicon (and other elements where desired forming the host matrix) and fluorine, together with any other compensating materials which may be used. Fluorine compensated amorphous semiconductor materials act more like crystalline materials and are more useful in photoconductive and photovoltaic devices like solar cells and photoreceptor devices, and in current controlling devices, including p-n junction rectifiers transistors and the like. In the case of silicon materials, the density of localized defect states is reduced at least by a factor of 10 or more from what was heretofore achieved, so that the minimum density of the defect states is less than $10^{16}$ per cubic centimeter per eV.

While the broader aspects of the invention envision the compensation or alteration of an amorphous semiconductor silicon-containing body or the like with compensating or altering agents in a separate environment from the environment in which the body is formed, it is believed that the compensation or alteration of an amorphous film formed by glow discharge deposition equipment can be best achieved by injecting at least fluorine into the amorphous semiconductor film more advantageously as it deposits on the substrate in the glow discharge deposition process. The amounts of the compensating or altering agents including fluorine are selected to achieve the best results for the intended use of the particular film involved.

In the case of silicon bodies, when a compensating or altering agent in addition to fluorine is used, the second agent is most advantageously hydrogen. The fluorine and its compensating or altering agents are most desirably introduced in the film involved in an activated form (e.g. atomic, free radical or ionic forms thereof) and they are preferably activated in the vicinity of the substrate upon which the amorphous semiconductor film is depositing, so that the one or more compensating or altering agents reduce the localized defect states involved in the most efficient and effective manner possible. Such activated hydrogen and fluorine, for example, is produced inherently where the compensating or altering materials are introduced in a gaseous compound in a molecular gaseous form in a glow discharge environment.

In a specific preferred embodiment of the invention, the silicon of the host matrix is formed in the glow discharge deposition process from a compound comprising silicon tetrafluoride ($SiF_4$) which supplies also the fluorine as one compensating or alterant element. While fluorine could be added in the form of a molecular gas in its glow discharge deposition environment, the difficulty of handling such as corrosive gas mitigates against its use in the preferred form of the invention. While silicon tetrafluoride can form a plasma in a glow discharge, it is extremely difficult to deposit silicon therefrom. However, it has been discovered that silicon deposition takes place if the atmosphere for the glow discharge includes preferably molecular hydrogen made reactive by the glow discharge which changes it to atomic hydrogen or hydrogen ions or the like. This reactive hydrogen reacts in the glow discharge with the silicon tetrafluoride so as to readily cause decomposition thereof and deposit amorphous silicon therefrom on the substrate. At the same time, fluorine and various silicon sub fluorides are released and made reactive by the glow discharge. Also, the reactive hydrogen as well as the reactive fluorine species are incorporated in the amorphous silicon host matrix as it is being deposited and operate to satiate or cap the dangling bonds and other defects and in addition, alter the semiconductor matrix and in such a way that the number of defects formed is diminished. Hence, these alterant elements reduce substantially the density of the localized defect states in the energy gap, with the foregoing beneficial results accuring.

In the case where fluorine and hydrogen are used to compensate or alter a silicon-containing body, it is believed that the activated hydrogen is effective in reducing the localized states in the energy gap at or near the Fermi level, while the activated fluorine further reduces these states as well as other states between those near the Fermi level and the conduction band. The activated fluorine especially readily diffuses into and bonds to the amorphous silicon in the matrix body, substantially to decrease the density of localized defect states therein, because the small size of the fluorine atoms enables them to be readily introduced into the amorphous silicon matrix. The fluorine bonds to the dangling bonds of the silicon and forms what is believed to be a partially ionic stable bond with flexible bonding angles, which results in a more stable and more efficient compensation or alteration than is formed by hydrogen and other compensating or altering agents. Because of its exceedingly small size, high reactivity, specificity in chemical bonding, and highest electronegativity, fluorine is qualitatively different from other halogens and so in considered a super-halogen. These factors make fluorine and extremely efficient compensating and altering agent.

It is believed that the silicon-containing fluorine-hydrogen alloy so formed has a lower density of defect states in the energy gap than that achieved by the mere elimination of dangling bonds and similar defect states. The alloying amounts of fluorine, in particular, is believed to participate substantially in a new structural configuration of an amorphous silicon-containing material and facilitates the addition of other alloying materials, such as germanium. Fluorine, in addition to its other characteristics mentioned herein, is believed to be an organizer of local structure in the silicon-containing alloy through inductive and ionic effects. It is believed that fluorine also influences the bonding of hydrogen by acting in a beneficial way to decrease the density of defect states which hydrogen otherwise contributes while it is acting as a density of states reducing element. The ionic role that fluorine plays in such an alloy is believed to be an important factor in terms of the nearest neighbor relationships.

In any amorphous semiconductor body the Fermi level cannot be moved almost completely to the valence or conduction band needed to make a good p-n junction unless a very low density of localized state is present. In the attempted doping of the silane glow discharge deposition of silicon films above described with an n-conductivity dopant, the Fermi level was moved to only within 0.2 eV of the conduction band. In the present invention, for example, the addition of an n-conductivity dopant, like arsenic, introduced in its form of arsenic gas in the glow discharge deposition environment, to an amorphous silicon body moves the Fermi level substantially all of the way to the conduction band. The addition of an n-dopant like arsenic to an amorphous silicon film shifts the Fermi level to a point near the conduction band because it is believed that the addition of activated hydrogen substantially reduces the localized states at or near the Fermi level and the addition of fluorine substantially reduces the density of localized defect states between those at or near the Fermi level and the conduction band. Therefore, a good n-conductivity amorphous silicon film results from such compensation of the body.

The production of highly efficient solar cells requires long drift lengths so that a large number of charge carriers can be separated and collected in response to the reception of photons. This requires a large depletion region in the amorphous semiconductor body which is a thin film in such an application. The comparable depletion region is obtained in an intrinsic film when there is a low density of localized defect states producing a low dark conductivity in the amorphous semiconductor film. Such semiconductor film is useful in a Schottky barrier solar cell. However, when it is desired to form a p-i-n or p-n junction solar cell, it is necessary to add dopant agents to move the Fermi level substantially toward the valence and conduction bands to form effective solar cell p and n regions. In such case, a relatively small amount of dopant is added to the film, so that a sufficiently wide depletion region is maintained. As previously indicated, a low density of localized defect states (with an accompanying low density of recombination centers) enables the amorphous semiconductor film involved to be effectively doped, thusly to form such effective p and n junctions useful in photo-cells. To increase the photoconductive properties of amorphous semiconductor films further, the low density of localized defect states makes readily possible also the addition of sensitizing agents like zinc and copper to increase carrier lifetime. If a high dark conductivity is desired, much larger amounts of the dopant agent would generally be added to the portion of the film involved.

The principles of this invention have its most important utility in amorphous silicon alloy films, including silicon and other Group IV elements having normal tetrahedral bonding and three-dimensional stability, especially germanium. Other amorphous alloys which have bonding configurations with fluorine and hydrogen or the like analogous to those existing in the alloys described above are also to be encompassed within the present invention.

Oxygen as a structural element does not have deleterious effects and may contribute in an alloying or structural way which assures amorphicity. Carbon, as an element when properly introduced, can be an alloying agent and still be utilized with hydrogen and fluorine.

In summary, to bring the significance of the present invention into focus, it is believed that the present invention provides amorphous semiconductor bodies which are electronically more like crystalline bodies than heretofore achieved for use in the manufacture of photoconductive and photovoltaic devices and and p-n junction current control devices and the like, despite the previously accepted dogma that amorphous semiconductor materials could not be produced in a manner to be similar to their crystalline counterparts. Additionally, the present invention provides large area, high yield, low cost amorphous semiconductor bodies which provide maximum recombination site compensation, charge carrier separation, and collection for solar cells and, therefore, produce such high energy conversion efficiencies that they should materially contribute to the solution of the energy shortage problems confronting the world to a greater degree each year.

DESCRIPTION OF DRAWINGS

FIG. 1 is a diagrammatic illustration of an apparatus for the glow discharge decomposition of a compound to deposit a solid amorphous host matrix and to alter and dope the same.

FIG. 2 is a sectional view through a portion of the apparatus illustrated in FIG. 1 and taken substantially along the line 2—2 of FIG. 1.

FIG. 3 is a fragmentary view of a photoresponsive device, such as found in a Xerox drum, including an amorphous semiconductor film made in accordance with this invention.

FIG. 4 is a fragmentary view of a photodetection device which includes an amorphous semiconductor film made in accordance with this invention.

FIG. 5 is a fragmentary view of one embodiment of a solar cell to illustrate one application of the amorphous semiconductor film made in accordance with this invention and being directed to a Schottky barrier device.

FIG. 6 is a p-i-n solar cell device which includes an amorphous semiconductor film made in accordance with this invention.

FIG. 7 is a fragmentary view of a p-n junction solar cell device utilizing an amorphous semiconductor film made in accordance with this invention.

FIG. 8 is a heterojunction photovoltaic device including an amorphous semiconductor film made in accordance with this invention.

FIG. 8A is a m-i-s solar cell utilizing an amorphous semiconductor film made in accordance with this invention.

FIG. 8B is a p-n-p transistor-like device utilizing an amorphous semiconductor film made in accordance with this invention.

FIG. 9 is a graph setting forth curves plotting dark electrical conductivity, $\sigma\Omega$ cm)$^{-1}$, against inverse temperature, ($10^3$/T), for various ratios of silicon tetrafluoride to hydrogen, SiF$_4$/H$_2$, in the reaction gas for showing decrease in the electrical conductivity for increase in hydrogen content in the reaction gas.

FIG. 10 is a graph setting forth curves for various ratios of SiF$_4$/H$_2$ in the reaction gas, giving (a) room temperature dark electrical conductivity, $\sigma_D(\Omega$ cm),$^{-1}$ and (b) the electrical activation energy, $\Delta E$(eV), and (c) preexponent $C_o$.

FIG. 11 is a graph setting forth a curve for various ratios of SiF$_4$/H$_2$ in the reaction gas giving E$_{04}$(eV), the photon energy for which the absorption coefficient is $\alpha = 10^4$cm$^{-1}$.

FIG. 12 is a graph setting forth curves for various ratios of SiF$_4$/H$_2$ in the reaction gas giving the photoconductivity, $\sigma_P = \sigma_L - \sigma_D$ ($\Omega$cm)$^{-1}$, where $\sigma_L$ is the electrical conductivity under light and $\sigma_D$ is the dark electrical conductivity, for two types of incident radiation, where $\sigma_P$ is measured (a) under AM-1 condition radiation, incident power of 90 mWcm$^{-2}$, and (b) under monochromatic radiation, radiation at $\lambda = 600$ nm with incident flux density of N$_o = 6 \times 10^{14}$s$^{-1}$cm$^{-2}$.

FIG. 13 is a graph wherein (a) the curve is a plot of incident monochromatic radiation, h$\nu$ (eV), where h is a constant and $\nu$ is inversely proportional to the wavelength, versus the photocurrent expression $$\left[\frac{i_p h\nu}{e N_o (1-R)}\right]^{\frac{1}{2}},$$

and where the E$_o$ intercept defines the optical gap, and (b) the curve is a plot of the optical gap, E$_o$(eV), for different ratios of SiF$_4$/H$_2$ in the reaction gas.

Figure 14:
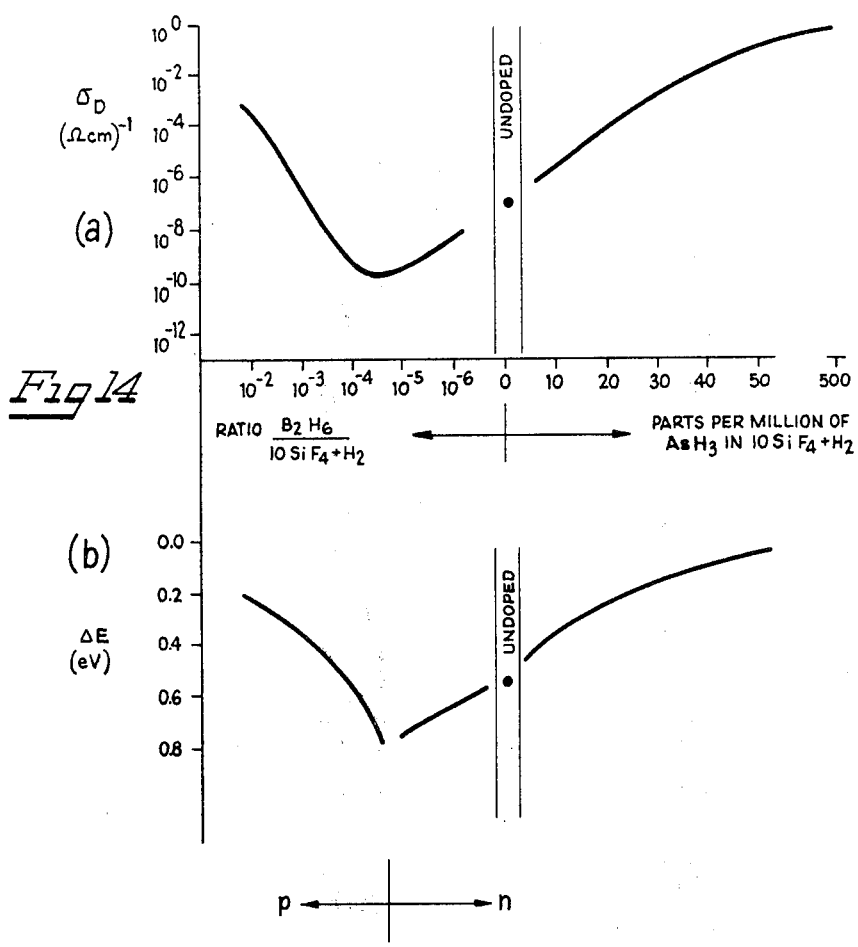

FIG. 14 is a graph which plots the amount of doping of a SiF$_4$+H$_2$ film of this invention in the p and n directions in (a) versus dark electrical conductivity, $\sigma_D$, and in (b) versus electrical activation energy, $\Delta E$.

Figure 15:
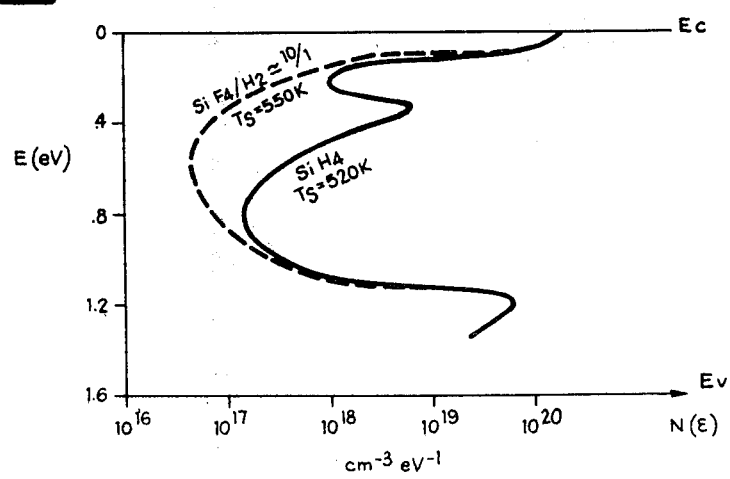

FIG. 15 is a graph which plots the density of localized states in the energy gap, N(E), versus electron energy, E(eV) in the energy gap. T$_s$ is the substrate temperature.

DESCRIPTION OF EXEMPLARY EMBODIMENTS OF INVENTION

The method and apparatus for depositing the semiconductor host matrix by glow discharge deposition, diagrammatically illustrated in FIGS. 1 and 2, includes a housing 10 providing a vacuum chamber 11, an inlet chamber 12 and an outlet chamber 13. A cathode backing member 14 is mounted in the vacuum chamber 11 through an insulator 15 and it is circumferentially provided with an insulating sleeve 16 and a dark space shield 17. A substrate 18 is secured to the inner end of the cathode backing member 14 by a holder 19 which may be screwed onto the cathode backing member 14 in electrical contact therewith. The cathode backing member 14 is provided with a well receiving an electrical heater 20 for heating the same and a temperature responsive probe 21 for measuring the temperature of the cathode backing member 14. The temperature probe 21 is used in connection with the control of the energization of the heater 20 to maintain the cathode backing member 14 and hence the substrate 18 at desired selected temperatures.

The apparatus also includes an electrode 23 which is secured in the vacuum chamber 11 of the housing 10 in spaced relation to the cathode backing member 14. The electrode 23 is provided with a shield 24 which in turn carries a substrate 25. The electrode 23 is also provided with a well for receiving an electrical heater 26 and with a well receiving a temperature probe 27. The temperature probe 27 is used in connection with the control of the energization of the heater 26 to maintain the electrode 23 and hence the substrate 25 at desired selected temperatures. The space in the vacuum chamber 11 between the cathode backing member 14 and the electrode 23 provides for a glow discharge condition therebetween so as to produce a plasma therebetween. The cathode is electrically connected to a source of power comprising an R.F. or D.C. energy source which are regulatable and the electrode 23 is connected to ground to provide the desired glow discharge therebetween. The vacuum chamber 11 is evacuated by a vacuum pump 30 through a particle trap 31 and a pressure gauge 32 indicates the vacuum pressure in the vacuum chamber 11 which is used in connection with the control of the vacuum pump.

The inlet chamber 12 of the housing 10 is preferably provided with a plurality of conduits 34 for introducing materials into the housing 10 to be mixed therein and to be deposited in the vacuum chamber 11 by glow discharge decomposition between the cathode 14 and the electrode 23 on the substrates 18 and 25. If desired, the inlet chamber 12 could be located at a remote point for premixing the gases thereat before they are fed into the vacuum chamber 11 of the housing 10. The materials are fed to the conduits 34 through filters or purifying devices 35 under the control of valves 36. The valves 36 control the rate of admission of the materials into the vacuum chamber 11. Where a material which is not in gaseous form but in a liquid or solid form is to be utilized, it may be arranged within a closed container 37 as indicated at 38, the material 38 being heated by a heater 39 to increase the vapor pressure thereof so as to provide a vapor thereof in the container 37. A suitable gas is fed through a dip tube 40 into the material 38 so as to entrap vapors of the materials 38 and convey the same through the filter or purifying device 35 into its associated conduit 34 for introduction into the vacuum chamber 11. The inlet chamber 12 and the outlet chamber 13 are provided with screens 42 to confine the plasma in the vacuum chamber 11 principally between the cathode 14 and the electrode 23.

The materials fed through the conduits 34 and mixed in the inlet chamber 12 are subjected to the glow discharge decomposition between the cathode 14 and the electrode 23 in the vacuum chamber 11 so as to provide the desired glow discharge decomposition and the formation of the amorphous host matrix on the substrates 18 and/or 25 and the incorporation of the desired alterant and/or dopant or other materials therein.

In the operation of the apparatus illustrated in FIGS. 1 and 2, the system is first pumped down to a pressure less than about 20 m torr prior to deposition. A gas of silicon tetrafluoride ($SiF_4$) is fed into the inlet chamber 12 through one of the conduits 34 and molecular hydrogen gas ($H_2$) is fed into the inlet chamber 12 through another of the conduits 34, the two gases being premixed in the inlet chamber 12. The gas mixture may be fed at a constant $SiF_4/H_2$ ratio of about 5/1 into the vacuum chamber 11, the pressure of which is maintained within the range of about 0.3 to 2 torr. The partial pressure in the vacuum chamber 11 and the gases introduced therein provide an atmosphere therein which contains such gases. A plasma is generated in said atmosphere between the substrates 18 and 25 using either a D. C. voltage of about 2000 volts or by radio frequency power of about 20.5 watts, operating at 13.56 MHz or other desired frequency, assuming an electrode spacing of about ½-1 inches and deposition area of 5–20 square inches.

While a self-sustained plasma is obtained for $SiF_4$, $SiF_4+Ar$, $SiF_4+H_2$ gas mixtures, however, in our experience the deposition of a silicon film occurs on the substrates 18, 25 only for the last mixture including $SiF_4+H_2$. The introduction of $H_2$ is very important for a successful deposition of a film. This is due to the fact that in the plasma region between the substrates 18 and 25, the hydrogen molecules $H_2$ are disassociated into their atomic or ionic species. The H atoms or ions are very reactive and possess far too much energy for direct recombination. This energy is dissipated into an inelastic collision involving the $SiF_4$ molecules with the result that the $SiF_4$ molecules decompose into a variety of species such as atoms, sub-fluorides, free radicals, ions, both stable and unstable of the silicon and the fluorine. This decomposition into silicon occurs in a very active environment containing reactive hydrogen and reactive fluorine. The properties of the deposited silicon films on the substrates 18 and 25 vary markedly with the ratio of $SiF_4$ and $H_2$ in the starting mixture which is explained in a consistent manner on the basis of inclusion of H and F in the final deposit of the amorphous silicon.

The substrate temperature is most advantageously in the range of from about 200° C. to 350° C., and preferably about 250° C. The broadest aspect of the invention envisions the fluorine compensation or altering of the depositing silicon film in the glow discharge environment at a more ideal substrate temperature for fluorine compensation or alteration, namely a temperature like about 400° C., which is in excess of that where hydrogen will remain in and compensate or alter the depositing film. Then, in either the same or a different environment but at a much lower substrate temperature like about 200° C., hydrogen, compensation or alteration, is carried out by introducing the hydrogen into the previously fluorine compensated or altered film by a glow discharge or other process which enables the hydrogen readily to diffuse and bond with the fluorine compensated or altered film. (It should be understood that the temperatures referred to in this application are measured by the thermocouple placed about one-half inch from the substrate.)

The electrical conductivity of glow discharge deposited films can be described by the equation:

$$\sigma = \sigma_o \exp\left[-\frac{(\Delta E)}{kT}\right] + \sigma'_o \exp\left[-\left(\frac{T_o}{T}\right)^{\frac{1}{4}}\right]$$

The first term of the equation describes the conduction of thermally generated carriers into the extended states above $E_c$ (the conduction band) or below $E_v$ (the valence band). The second term of the equation represents conduction by hopping within the localized defect states of the energy band and this is predominant when the density of localized defect states is large, as with unaltered silicon or the like. The pre-exponent in the first term of the aforementioned equation is represented by:

$\sigma_o = e\mu_e N(E_c) kT \exp(\delta/k)$ for electrons and $\sigma_o = e\mu_h N(E_v) kT \exp(\delta/k)$ for holes where $N(E_c)$ and $N(E_v)$ are the effective densities of states at the conduction band mobility edge $E_c$ and of the valence band mobility edge $E_v$, respectively. $\mu_e$ and $\mu_h$ are the mobilities of electrons and holes, respectively, in the extended states. $\delta$ describes the temperature dependence of the band edges and k is a constant.

FIG. 9 shows a series of curves for log $\sigma$ vs. $10^3/T$ for several samples including the designated ratios of $SiF_4/H_2$ in the reaction gas, namely, 99:1, 80:1, 30:1 and 15:1. It is clear that as the $H_2$ content of the gas mixture is increased, the conduction mechanism in the films changes from an unactivated process involving hopping to a well defined activated process involving thermally generated carriers. The samples having the ratios 99:1 and 80:1 can be described by the second term in the aforementioned equation involving hopping and the samples involving the ratios of 30:1 and 15:1 can be described by the first term of the aforementioned equation involving thermally generated charge carriers. It is thus seen that the dark electrical conductivity at room temperature of the various samples decreases substantially as the H content in the samples increases.

FIG. 10 summarizes the parameters (a) room temperature dark conductivity $\sigma_D$, (b) the activation energy, $\Delta E$, and (c) the preexponent $\sigma_o$. The activation energy for samples having the ratios 99:1 and 80:1 as indicated in (b) are unactivated, as discussed above, while the other samples having the ratios 30:1 and 15:1 are activated. In order to obtain $\Delta E$ and $\sigma_o$ for $SiF_4/H_2$ greater than 80:1, tangents to the curves therefor in FIG. 9 at room temperature were drawn. This figure shows clearly that a transition in the conduction mechanisms occurs in the range $30/1 < SiF_4/H_2 < 80/1$. The factor $\sigma_o$ as shown in (c) changes by six orders of magnitude. The room temperature dark conductivity $\sigma_D$ decreases markedly as the $H_2$ content in the mixture increases. A minimum in the electrical conductivity $\sigma_D$ occurs at a ratio $SiF_4/H_2$ at about 15:1 and the electrical conductivity $\sigma_D$ increases with further reduction in the ratio.

FIG. 11 shows that the energy or band gap $E_{04}$ (defined as the photon energy at which the absorption coefficient $\alpha = 10^4 cm^{-3}$ increases as the ratio $SiF_4/H_2$ is decreased. There is a correlation between the ratio of $SiF_4/H_2$ in the gas mixture and the ratio of Si/H and the ratio of Si/F in the deposited film although, these correlations may not be a one-to-one correlation. When alloys are formed, the $E_{04}$ increases since hydrogen is incorporated into the film increasingly when the ratio $SiF_4/H_2$ is decreased. This results in an increase in the number of Si-H bonds and since these bonds are stronger than the Si-Si bonds, $E_{04}$ is therefor increased. The increase in the incorporation of hydrogen within the deposited film reflects in changes in the optical and electrical properties as is presented in FIGS. 9 to 11.

The least hydrogenated samples (99:1 and 80:1) exhibit an unactivated conduction, the conduction being n-type and yielding a localized state density greater than $10^{19} cm^{-3} (eV)^{-1}$. The conduction of such samples is dominated by hopping of electrons situated around the Fermi level. As the ratio $SiF_4/H_2$ is decreased, it is noted from FIGS. 9 and 10 that the electrical conductivity decreases by orders of magnitude and the change to a well-defined activation energy takes place. These samples remain n-type and the conduction mechanism is electron conduction within the extended states at the conduction band. The above transition from a hopping conduction to a well activated conduction is due to hydrogen and fluorine incorporation into the amorphous silicon film. The localized states originate from a variety of sources, such as dangling bonds, voids, defects, etc. With increased hydrogen inclusion, the dangling bonds are eliminated to alter the semiconductor matrix in such a way that the density of localized defect states is reduced. When a sufficient reduction takes place, a transition in the conduction mechanism, of the above type, occurs.

It is generally known that in the weakly absorbing part of the energy spectrum, such that $\alpha d$ is less than 1 where $\alpha$ is the absorption coefficient $(cm^{-1})$ and d (microns) is the thickness of film, the photocurrent in the film can be expressed in the following way, $$\left[ \frac{I_p h\nu}{eN_o(1-R)} \right]^{\frac{1}{2}} = \text{constant} \times (h\nu - E_o)$$

where Ip=photocurrent, h=Plancks constant, $\nu$=inverse proportional to the wave length of the incident radiation, $N_o$=incident flux density of the radiation, R=reflection coefficient, e=electronic charge and $E_o$=optical gap. FIG. 13(a) shows a plot of these parameters. Extrapolating the well-defined straight region leads to an intercept on the h $\nu$ axis, which yields the optical gap, $E_o$. FIG. 13(b) shows the variation of $E_o$ with $SiF_4/H_2$. There is a general increase in optical gap, $E_o$, with increasing hydrogen incorporation and agrees well with $E_{o4}$ variation with variation of the $SiF_4/H_2$ ratio. The highly photoconducting films occurs when the ratio $SiF_4/H_2$ is about 10:1. This is shown in FIG. 12(a) and (b) for two types of incident radiation where $\sigma_P$ is plotted as a function of $SiF_4/H_2$ gas ratio. When these films were subjected to prolonged AM-1 radiation, no photostructural change with respect to its properties was noted.

As expressed above, the glow discharge deposition of the amorphous silicon film from silicon tetrafluoride in an atmosphere containing hydrogen, wherein the hydrogen and fluorine are made reactive by the glow discharge and are incorporated into the film for altering the same, gives drastically improved results over silicon films formed by glow discharge of silane and other hydrogen as mentioned in carbon U.S. Pat. No. 4,196,438. This is graphically illustrated in FIG. 15 wherein the density of staes, $N(E)$ $cm^{-3} eV^{-1}$, as a function of electron energy $E(eV)$ between the conduction band $E_c$ and the valence band $E_V$ is plotted for the two films. The solid curve shows the film deposited from silane $(SiH_4)$ at a substrate temperature of about 250° C. and the dotted curve shows the film deposited from silicon tetrafluoride $(SiF_4)$ in an atmosphere containing hydrogen $H_2$ having $SiF_4/H_2$ gas ratio of 10/1 at a substrate temperature of about 250° C. The $SiF_4/H_2$ gas ratio most advantageously is no greater than 14/1, and not less than about 2/1, and is preferably about 5/1.

It is first noted that the density of localized states of the $SiF_4/H_2$ film is much less than that of the $SiH_4$ film, the former being in the range of $10^{16} cm^{-3} eV^{-1}$ and the latter being in the range of $10^{17} cm^{-3} eV^{-1}$. These densities of states are determined by the field effect technique and these numbers represent upper limits. It is also noted in FIG. 15 that the $SiH_4$ film has a hump or bump at substantially 0.4eV of the energy gap which hinders by subsequent doping the shifting of the Fermi level by doping much beyond this point and not beyond an energy gap value of 0.2 eV. However, in the $SiF_4/H_2$ film of this invention, the bump is completely eliminated so that the Fermi level can be shifted substantially to the conduction band $E_C$. This is due to the combined use of the hydrogen and the fluorine as compensating or alterant elements in the semiconductor film of this invention and is an important factor of this invention. It is, therefore, possible in the $SiF_4/H_2$ produced film to readily modify or dope the film to shift the Fermi level substantially as desired.

In the $SiH_4$ produced film, there is also a hump at the 1.2 eV value in the energy gap which prevents the shifting of the Fermi level much therebeyond toward the valence band $E_V$. By utilizing other compensating or alterant elements during the glow discharge deposition of the $SiF_4/H_2$ film a curve corresponding to the dotted curve extending toward the valence band could also be provided. This further reduction of localized defect states in the gap near the conduction band and the valence band make the amorphous semiconductor film of this invention the substantial equivalent of crystalline semiconductors so that the amorphous semiconductor material of this invention may be readily doped as in crystalline semiconductors to obtain all of the favorable attributes thereof.

As previously indicated, to produce useful amorphous silicon films which have the desired characteristics for use in solar cells, p-n junction current control devices, etc., the compensating or altering agents produce a very low density of localized defect states in the energy gap without changing the basic intrinsic character of this film. Compensation of dangling bonds and the like is achieved with the addition to the amorphous films of hydrogen and fluorine of far less than one atomic percentage of the amorphous composition involved. The amount of fluorine and hydrogen most desirably used forms a silicon-fluorine-hydrogen alloy, where both the hydrogen and fluorine may constitute well in excess of even one atomic percentage of the alloy, such as about 3 atomic percent and as much as about 10 percent. The amount of fluorine is preferred to be about 3 atomic percent and the amount of hydrogen is preferred to be about 5 atomic percent of the alloy.

The temperature of the substrate is adjusted to obtain the maximum reduction in the density of the localized defect states in the energy gap of the amorphous semiconductor film involved. The substrate surface temperature will generally be such that it ensures high mobility of the depositing materials, and one below the crystallization temperature of the depositing film.

In this connection, reference is made to FIG. 14, wherein doping of the semiconductor material of this invention with arsene $(AsH_3)$ toward n-type conductivity and with diborane ($B_2H_6$) toward the p-type conductivity are illustrated. In 14(a) the undoped semiconductor of this invention has an electrical conductivity of about $10^{-7}$ $(\Omega cm)^{-1}$ and in FIG. 14(b) it has an electrical activation energy of about 0.6 eV. When the semiconductor material is doped with arsine in small amounts, parts per million, the dark electrical conductivity increases substantially which establishes that the Fermi level may be readily and easily shifted to the conduction band with a minimal amount of modification or doping. Also, as shown in FIG. 14(b) the electrical activation energy $\Delta E$ is substantially reduced by the use of small amounts of such dopant.

Where, however, diborane is used as the dopant toward p-type conductivity relatively large amounts of p-dopant material are required. This p-type dopant first acts to decrease the dark electrical conductivity and to increase the electrical activation energy to a point where the ratio of the diborane to the $SiF_4+H_2$ amounts to about $10^{-4}$. At the same time, the electrical activation energy is increased. Thereafter, further increases in the ratio operate to decrease the electrical conductivity and decrease the electrical activation energy as seen from FIG. 14. Considerably more doping toward the p-type conductivity is required, this being due to the density of defect states near the valence band. As expressed above, the amount of doping toward the p-type conductivity, may be decreased substantially by utilizing a further compensating or alterant material for decreasing the density of defect states near the valence band. In addition to utilizing diborane ($B_2H_6$) for p-type doping, for example, $Ga(CH_3)$ or $(C_2H_5)$, Al, or the like may be utilized. Here, the gallium and the aluminum included in the film are obtained from these gases.

Thus, in accordance with this invention, the use of $SiF_4/H_2$ as the gases to be decomposed by glow discharge, in addition to decreasing the density of defect states in the energy gap also provide for ready shifting of the Fermi level with small amounts of dopants at least to the conduction band. The dopants arsine and diborane are supplied through appropriate conduits 34 into the inlet chamber 12 where they may be premixed into the $SiF_4+H_2$ gas so that they are incorporated in the amorphous silicon film as the same is being glow discharge deposited in the vacuum chamber 11. The glow discharge breaks up these gases into a variety of species, such as atoms, free radical, ions, both stable and unstable including arsenic from the arsine or boron from the diborane, which are incorporated as dopants into the amorphous film while the same is being deposited.

Due to the nature of the amorphous semiconductor films of this invention, which substantially simulate crystalline semiconductors, having relatively low dark electrical conductivity, relatively high light electrical conductivity or photoconductivity, ease of doping for n and p-type conduction and shifting of the Fermi level to the conduction and valence bands, and increased carrier drift mobility, including hole mobility as well as electron mobility, it is possible, for the first time, to make commercially acceptable amorphous semiconductor devices. Examples of some of such devices are diagrammatically illustrated in FIGS. 3 to 8.

FIG. 3 diagrammatically illustrates a fragment of a photoresponsive device such as found on a Xerox drum, including a amorphous semiconductor film 51 compensated or altered in the manner previously described which is deposited on a metal substrate 50. The metal substrate 50 is highly conductive and selected to provide ohmic contact 52 with the amorphous semiconductor film 51. The amorphous semiconductor material in this example is of the n-type conductivity. Preferably in depositing the film 51 on the substrate 50 it is deposited n+ as indicated at 51' so as to provide an n to n+ junction 52' to assure a low ohmic contact between the film 51 and the substrate 50. In Xerox use, the film 51 is normally charged and the film of the invention retains its charge because of the relatively low dark electrical conductivity thereof. When, however, the film is imagewise subjected to light radiation, the electrical conductivity thereof is increased where so radiated so as to release the charge thereat and this is made possible by the relatively high light electrical conductivity or photoconductivity of this invention. The differences in the charged and uncharged portions of the film control a toner applied to the film for providing suitable images in a xerographic process.

FIG. 4 diagrammatically illustrates a photodetection device which includes an amorphous semiconductor film 51 compensated or altered in the manner previously described and applied or deposited on a metal substrate 50 at 52. A light transmitting metal film 53, is applied to the semiconductor film 51 to form an electrode therefor. The film 53 has good electrical conductivity as does the substrate 50. Electrodes 55 are provided for applying a voltage across the film 53 and substrate 50 which is normally blocked by reason of the relatively low dark electrical conductivity of the film 51. An anti-reflection layer 56 may be applied over the film 53 and electrodes 55. When incident radiation is applied to the device of FIG. 4, the device will conduct current because of the relatively high light electrical conductivity or photoconductivity of the film of the invention. Thus, a current in a circuit may be controlled in accordance with the amount of incident radiation applied to the device. In order to assure ohmic contact between the film 51 which has n-type conductivity and the metal film 53 and substrate 50, the film 51 is doped n+ at 51', the surfaces between the film 51 and the n− doped portions 51' being indicated at 52' and 54'.

FIG. 5 is a diagrammatic illustration of a Schottky barrier type solar cell. It includes a metallic substrate 50 on which is deposited at 52 a semiconductor film 51 compensated or altered in the manner previously described. In order to insure good ohmic contact between the semiconductor film 51 and the metal substrate 50, the film 51 is highly doped n+ as indicated at 51', the juncture of the film 51 and the highly doped portion 51' thereof being indicated at 52'. A metallic film 58 is deposited at 59 on the semiconductor film 51 and the metallic film 58 is transparent to solar radiation and is of a metallic material with good electrical conductivity and of a high work function, as for example, platinum, palladium, chromium, iridium or rhodium. On the surface of the metallic film 58 is a grid type electrode 60 having good electrical conductivity. The function of the grid electrode 60 is for the uniform collection of current from the metallic layer 58. An antireflection layer 61 which is transparent is deposited over the metallic film 58 and electrode 60.

A Schottky barrier is formed at the interface 59 by contacting the metallic film 58 with the amorphous film 51. The Schottky barrier generates a space charge region in the semiconductor material 51 which penetrates into the same from the interface. The space charge region is also referred to as the depletion region and preferably the depletion region extends the entire width of the semiconductor film 51. Carriers created anywhere in the film 51 as a result of the absorption of solar radiation are swept by the electric field in the depletion region to enter the metallic substrate 50 or the metallic film 58. In this way, a photovoltaic current is produced which can be introduced into a circuit connected to the metallic substrate 50 and the grid type electrode 60.

A photovoltaic device and more particularly a p-i-n solar cell is diagrammatically illustrated in FIG. 6. It includes a semiconductor film 66 compensated or altered in the manner previously described deposited on a metallic substrate 65. The semiconductor film 66 includes a portion 67 which is doped to be n-type, a central portion 68 which is essentially intrinsic although it is slightly n-type and doped p-type portion 69. A transparent metallic film 70 is deposited over the semiconductor film 66, the substrate 65 and the film 70 operating as electrodes for conducting current generated by the photovoltaic device. In order to provide an ohmic contact between the metallic substrate 65 and the n doped portion 67, the portion 67 is highly doped n+ as indicated at 67'. Likewise, in order to provide ohmic contact with the metallic film 70, the p doped portion 69 of the semiconductor film is highly doped p+ as indicated at 69'.

In such a p-i-n solar cell, as a result of the equalization in Fermi levels between portions 69, 67 and 68 there is a negative space charge in the portion 69 and a positive space charge in the portion 67 and the formation of built-in potential between the portions 69 and 68 and 67 and 68, and also the formation of a depletion region in the intrinsic portion 68. Preferably, the depletion region extends through the intrinsic portion 68 and, therefore, any carriers generated in the intrinsic portion 68 by the absorption of solar radiation will be swept up in the electric field of the depletion region and collected as an electrical current.

A p-n junction solar cell device is illustrated in FIG. 7. This photovoltaic device includes a metallic substrate 75 and an amorphous semiconductor material 76 compensated or altered in the manner previously described. The semiconductor film 76 includes a portion 77 which contacts the metal substrate 75 and which is highly doped n+ to make ohmic contact at 78 with the portion 79 which is doped n-type. The film also includes a portion 80 which is doped p-type to provide p-n junction 81 between the portions 79 and 80. The p-type doped layer 80 is further highly doped p+ as indicated at 80' so as to provide an ohmic contact with a transparent metallic film 83 contacting the semiconductor film 76. In the operation of this photovoltaic device, solar radiation enters the device through the transparent metallic film 83 and some of the solar radiation is absorbed in the semiconductor film 76 forming electron-hole pairs. These current carriers then diffuse to the p-n junction 81 and if they arrive at the space charge region of the p-n junction, before recombining they are collected and contribute to the current generated by the device.

FIG. 8 is a diagrammatic illustration of a heterojunction photovoltaic device including an amorphous semiconductor film 88 compensated or altered in the manner previously described. The film has n-type conductivity and it is provided with a highly doped n+ portion 86 where it contacts a metal substrate 85 so as to provide an ohmic contact 87 for the amorphous film 88. The device also includes a semiconductor film 89 joining the film 88 at 90. The film 89 may be of a different material than the film 88 and has a high band gap so as to be transparent to solar radiation impinging the same. The differences in band gap between the films 88 and 89 provide a large potential barrier in the vicinity of the junction 90, which forms a heterojunction, for the generation of a large open circuit voltage. The differences in the band gap produce band bending at the heterojunction 90. The semiconductor material 89 is heavily doped so as to provide substantially ohmic contact with electrodes 91. Because the semiconductor film 89 is highly doped, the electrical field generated by the potential barrier at the heterojunction 90 will not penetrate substantially into the film 89 but will penetrate substantially into the film 88. Accordingly, most of the space charge region, i.e. the depletion region, will be generated in the semiconductor film 88. Solar radiation which is absorbed within the depletion region in the semiconductor film 88 will generate electron-hole carriers which will be swept by the electrical field to either the electrode 91 or the substrate 85, thereby generating the electric current of the device.

FIG. 8A shows a m-i-s solar cell in fragmentary cross-section. The solar cell illustrated includes a substrate 92, previously described of a material having both good electrical conductivity properties and the ability of making an ohmic contact with an amorphous silicon film 94' compensated or altered with at least fluorine and also preferably hydrogen.

The film shown has an ohmic contact-providing region 94a next to the substrate 92, the region 94a' being shown as being a heavily doped n-plus region which forms a low resistance interface between the substrate 92' and an intrinsic region 94b'. Upon the amorphous film 94' is a thin solar energy transparent insulating layer which, for example, may be made of a titanium dioxide or silicon dioxide. Upon the insulating layer 95' is deposited a high-work function metal barrier film 97' like the barrier-forming layer in the Schottky barrier device described. Deposited upon the barrier-forming layer 97' are a grid electrode 98' and an antireflection layer 96', like the corresponding grid and layer 86 and 84 of FIG. 6.

Reference should now be made to FIG. 8B which shows a p-n-p current control device having outer electrodes 102 and 104 on the opposite faces of a film 105 of an amorphous semiconductor material like silicon, compensated or altered in accordance with the invention. The amorphous semiconductor film 105 has outermost p-doped regions 105a and 105a and a preferably doped base-forming intermediate region 105b of n-conductivity type. If the device is to form a transistor, a terminal connection is made to the baseforming region 105b of the film.

The thickness of the layers of the various devices shown in FIGS. 3 through 8B may vary widely. However, typical thicknesses for the layer forming regions of the amorphous films involved are of the order of magnitude of, for example, about 5000 Angstroms. The various adjacent regions of the films have thicknesses of the order of magnitude of about 100 to 200 Angstroms. Typical thicknesses of the anti-reflection layers is about 800 Angstroms. The insulating layer in the m-i-s device described is of the order of magnitude of about 20 Angstroms.

In the formation of devices, such as in FIGS. 3 to 8B the composition of the gases being decomposed can be rapidly changed such that any desired sequence of layers with different characteristics, such as, substantially intrinsic, p-type and n-type, p+-type and n+-type, can be fabricated by the glow discharge process of this invention.

As expressed above, other compounds than silicon tetrafluoride glow discharge decomposed in an atmosphere of hydrogen can be utilized in accordance with this invention. As one example, silane ($SiH_4$) can be decomposed in an atmosphere containing hydrogen to provide a substantial decrease in the density of states in the energy gap over that obtained merely by the glow discharge decomposition of silane.

Where the glow discharge decomposition of a compound containing silicon and involving different compensation or alterant elements, such as hydrogen and fluorine are involved, in addition to utilizing silicon tetrafluoride in an atmosphere containing hydrogen ($SiF_4+H_2$), other compounds and atmospheres may be utilized, as for example,

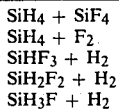

$SiH_4 + SiF_4$
$SiH_4 + F_2$
$SiHF_3 + H_2$
$SiH_2F_2 + H_2$
$SiH_3F + H_2$ where hydrogen and fluroine form the compensation or alterant elements incorporated into the amorphous semiconductor silicon host matrix.

Other examples of compounds and elements in the atmosphere include:

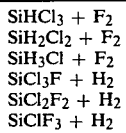

$SiHCl_3 + F_2$
$SiH_2Cl_2 + F_2$
$SiH_3Cl + F_2$
$SiCl_3F + H_2$
$SiCl_2F_2 + H_2$
$SiClF_3 + H_2$ wherein hydrogen and fluorine are compensation or alterant elements incorporated in the amorphous silicon host matrix.

Instead of utilizing only the Group IV element silicon (Si) another Group IV element may be utilized with silicon or instead of silicon such as germanium (Ge), by glow discharge decomposition including the following compounds in the following atmosphere:

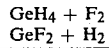

$GeH_4 + F_2$
$GeF_2 + H_2$ the hydrogen, fluorine and fluorine being therein for compensation or alteration purposes.

In summary, to bring the significance of the present invention into focus, it is believed that the present invention enables the fabrication of amorphous semiconductor films which are more similar to crystalline films for use in the manufacture of solar cells and current control devices including p-n junctions and the like, despite the previously accepted dogma that amorphous semiconductor materials could not be produced in a manner to be equivalent to their crystalline counterparts. Additionally, the present invention provides large area, high yield, low cost amorphous semiconductor films. Finally, the films produced so as to provide maximum charge carrier separation and collection for solar cells produce such high energy conversion efficiencies that they should materially contribute to the solution of the energy shortage problems confronting the world to a greater degree each year.

It is understood that numerous modifications may be made in the various preferred forms of the invention described, without deviating from the broader aspects thereof.

In the claims, when a reference is made to a "film", such expression is intended to cover a layer of material formed in a single process step or a multiplicity of layers of or similar material which may be formed sequentially in the same or different environments.

We claim:

1. A semiconductor film comprising a solid amorphous semiconductor host matrix including at least one element and having elecronic configurations which have an energy gap and a density of localized defect states therein, said host matrix including at least one element being formed by the glow discharge decomposition of a compound containing said at least one element and at least one compensating or alterant element in a partial vacuum having an atmosphere separately containing at least one different compensating or alterant element and not derived from the compound, wherein one of said different at least one compensating or alterant element of said compound and element separately contained in said atmosphere comprises at least fluorine and wherein both of the same were incorporated in said amorphous semiconductor host matrix during deposition thereof yielding compensated or altered amorphous semiconductor material having altered electronic configurations with a reduced density of localized defect states in the energy gap.

2. A semiconductor film comprising a solid amorphous semiconductor host matrix including at least one element and having electronic configurations which have an energy gap and a density of localized defect states therein, said host matrix including at least one element being formed by glow discharge decomposition of a plurality of compounds, each containing said at least one element and at least one different compensating or alterant element, wherein said different at least one compensating or alterant element of said compounds comprised at least fluorine incorporated in said amorphous semiconductor host matrix during deposition thereof, yielding an amorphous semiconductor material having electronic configurations with a reduced density of localized defect states in the energy gap.

3. An amorphous semiconductor film comprising a solid amorphous semiconductor host matrix with electronic configurations with an energy gap and a low density of localized defect states therein, said solid amorphous semiconductor host matrix being formed by glow discharge decomposition of at least one compound, said amorphous semiconductor host matrix incorporating a plurality of different complementary compensating or alterant elements including at least fluorine, yielding an amorphous semiconductor material having electronic configurations with a reduced density of localized defect of states in the energy gap.

4. A semiconductor film comprising a solid amorphous semiconductor host matrix including at least one element and having electronic configurations which have an energy gap and a density of localized defect states therein, said amorphous semiconductor host matrix including at least one element being formed by the glow discharge decomposition of a compound containing said at least one element and at least one compensating or alterant element comprising fluorine in a partial vacuum having an atmosphere separately containing at least one compensating or alterant element different from said at least one compensating or alterant element of the compound, wherein said at least one different compensating or alterant element separately contained in the atmosphere facilitates the glow discharge decomposition of said compound and deposition of said amorphous semiconductor host matrix, and wherein said at least one compensating or alterant element of said compound were incorporated in said amorphous semiconductor host matrix during deposition thereof, yielding an amorphous semiconductor material having electronic configurations with a reduced density of localized defect states in the energy gap.

5. A semiconductor film comprising a solid amorphous semiconductor host matrix including silicon and having electronic configurations which have an energy gap and a density of localized defect states therein, said amorphous semiconductor host matrix including silicon formed by glow discharge decomposition of a compound containing silicon and a compensating or alterant element including fluorine, wherein said compensating or alterant element of said compound was incorporated in said amorphous semiconductor host matrix during deposition thereof, yielding an amorphous semiconductor material having electronic configurations with a reduced density of localized defect states in the energy gap.

6. The film as defined in claim 1, 2, 3, 4 or 5, wherein said compensating or alterant elements were made reactive by the glow discharge.

7. The film as defined in claim 1, 2, 3, 4 or 5, wherein said host matrix includes hydrogen as 1 compensating or alterant element.

8. The film as defined in claim 1, 2, 3, or 4, wherein said at least one element of the amorphous semiconductor host matrix comprises silicon.

9. The film as defined in claim 1, 2, 3 or 4, wherein said at least one element of the amorphous semiconductor host matrix includes germanium.

10. The film as defined in claim 1 or 4 wherein said compound includes silicon and fluorine and said atmosphere includes hydrogen.

11. The film as defined in claim 3 or 5 wherein the host matrix includes boron, carbon, or nitrogen to withstand high temperatures.

12. The film as defined in claim 1, 2, 3 or 4 wherein a compensated or altered portion of the film is an alloy of the host matrix element or elements and hydrogen and fluorine.

13. The film as defined in claim 5 wherein said film is compensated or altered with both fluorine and hydrogen to form an alloy of silicon, hydrogen and fluorine.

14. The film as defined in claim 5 wherein said fluorine and hydrogen are between about 1 to 10 atomic percent of the compensated or altered portion of the film.

15. The film as defined in claim 3, 5 or 13 wherein at least an altered or compensated portion of said film forms the charge carrier-supplying portion of a photovoltaic cell.

16. The film as defined in claim 3, 5 or 13 wherein at least a compensated or altered portion of said film forms the charge carrier-supplying portion of a photovoltaic cell, and there is further formed in an altered or compensated portion of said film a heavily doped or modified ohmic contact interface-forming region between said charge carrier-supplying portion of the cell and an electrode of the cell.

17. The film as defined in claim 3, 5 or 13 wherein at least a compensated or altered portion of said film forms the semiconductor portion of a m-i-s photovoltaic cell.

18. The film as defined in claim 3, 4 or 13 wherein spaced or altered compensated portions of the film are doped to form p and n conductivity regions, and a compensated portion of the film between said p and n conductivity region being an undoped intrinsic region to form a p-i-n photovoltaic cell.

19. The film as defined in claim 3, 5 or 13 wherein at least a compensated or altered portion thereof forms the charge carrier-supplying portion of a photovoltaic cell, and said charge carrier-supplying portion of the cell include p and n conductivity regions having relatively small but sufficient amounts of a modifying material added thereto so that the Fermi level of said regions thereof are moved in opposite directions respectively at or near the valence and conduction bands.

20. The film as defined in claim 3, 5 or 13 having adjacent compensated or altered regions doped by dopants of opposite conductivity type to form at least one p-n junction in the film.

21. The film as defined in claim 3, 5 or 13 wherein at least a compensated or altered portion thereof forms the charge carrier-supplying portion of a Schottky barrier cell.

22. The film as defined in claims 3, 5, or 13 wherein said film includes a portion which is capable of holding a charge in an electrostatic image producing device.

23. The film as defined in claim 3, 5 or 13 wherein at least a portion of said film forms the charge carrier-supplying portion of a photovoltaic cell, which portion has a minimum density of localized defect states in the energy gap no greater than $10^{16}$ per cubic centimeter per eV.

24. The film as defined in claim 3, 5 or 13 wherein at least a portion of said film forms the charge carrier-supplying portion of a photovoltaic cell, which portion has a minimum density of localized defect states no greater than $10^{16}$ per cubic centimeter per eV, and there is further formed in a compensated or altered portion of said film a heavily doped ohmic contact interface region between said charge carrier-supplying portion of the cell and an electrode thereof, the conductivity of said ohmic contact interface region thereof is no less than about $10^{-1}$ (ohm cm)$^{-1}$.

25. The film as defined in claim 3, 5 or 13 wherein at least a portion of said film is an intrinsic, undoped charge carrier-supplying a portion of a photovoltaic cell.

26. The film as defined in claim 3, 5 or 13 wherein at least an altered or compensated portion of said film forms the charge carrier-supplying portion of a photovoltaic cell, and there is further formed in an altered or compensated portion of said film a heavily doped or modified ohmic contact interface-forming region between said charge carrier-supplying portion of the cell and an electrode of the cell, and wherein said ohmic contact interface-forming region is compensated by hydrogen and fluorine.

27. The film as defined in claim 3, 5 or 13 wherein at least an altered or compensated portion of said film forms the charge carrier-supplying portion of a photovoltaic cell, and there is further formed in an altered or compensated portion of said film a heavily doped or modified ohmic contact interface-forming region between said charge carrier-supplying portion of the cell and an electrode of the cell, and wherein both said charge carrier-supplying portion and said ohmic contact interface-forming region of said semiconductor body is compensated by hydrogen and fluorine.

28. The film as defined in claim 3, 5 or 13 wherein there are adjacent compensated regions of said film having dopants added thereto of at least three alternating conductivity types to form a transistor-like device.

29. The film as defined in claim 3, 5 or 13 in an electrical device wherein said host matrix film is deposited over a first electrode-forming layer and there is deposited over said host matrix film a second electrode-forming layer.

30. The film as defined in claim 3, 5 or 13 wherein said film is deposited over a first electrode-forming layer and there is deposited over said host matrix film a second electrode-forming layer, at least or part of the compensated or altered portion of said film forms the charge carrier-supplying portion of a radiant energy responsive device, one of said electrode-forming layers is formed to permit the passage of radiant energy to said host matrix portion, and any other intervening layers between such electrode-forming layer and said charge carrier-supplying portion of said film being radiant energy transparent.

31. The film as defined in claim 3, wherein said film is deposited over a first electrode-forming layer, and there is deposited over said host matrix film a second electrode-forming layer, said film forming the charge carrier-supplying portion of a photovoltaic cell, and there is formed between one of said electrode-forming layers and film a second semi-conductor film having a substantially different band gap than said host matrix.

32. The photovoltaic cell of claim 31 wherein the second semi-conductor film is transparent to said radiant energy and is located between said radiant energy passing electrode-forming layer and said host matrix so that said amorphous host matrix film absorbs said radiant energy.

33. The photovoltaic cell of claim 31 wherein said second semi-conductor film is transparent to radiant energy and is located in contact with and between said one radiant energy passing electrode and said host matrix, and wherein the large band gap difference between said host matrix and second semi-conductor film provides a large potential barrier for the generation of a large open circuit voltage.

34. The photovoltaic cell of claim 31 wherein said second semi-conductor film is a highly doped semi-conductor material.

35. The photovoltaic cell of claim 31 wherein said second semi-conductor film is an amorphous material compensated or altered to reduce the density of localized defect states therein.

36. The film as defined in claim 14 wherein said fluorine and hydrogen are each no greater than about 5 atomic precent of the compensated or altered portion of the film.

37. the film as defined in claim 14 wherein said fluorine is about 3 atomic percent and hydrogen is about 5 atomic percent of the compensated or altered portion of the film.

38. The film as defined in claims 1, 2, 3, 4 or 5 wherein said host matrix includes germanium.

39. The film defined in claim 5 wherein said host matrix includes carbon.

* * * * *

UNITED STATES PATENT AND TRADEMARK OFFICE
CERTIFICATE OF CORRECTION

PATENT NO. : 4,409,605  Page 1 of 5

DATED : October 11, 1983

INVENTOR(S) : Stanford R. Ovshinsky and Arun Madan

It is certified that error appears in the above-identified patent and that said Letters Patent is hereby corrected as shown below:

```
Column  1, line 35, delete "siliconalloy" and insert
--silicon-alloy--;
Column  1, line 63, after "for" delete ",";
Column  2, lines 29-30, delete "param-eters" and insert
--para-meters--;
Cloumn  3, line 57, delete "was" and insert --were--;
Column  4, line 61, delete "dischlorosilane" and insert
--dichlorosilane--;
Column  5, line 28, delete "intrisic" and insert
--intrinsic--;
Column  5, line 30, delete "extrisic" and insert
--extrinsic--;
Column  6, line 23, delete "clement" and insert --element--;
Column  6, line 39, after "sub" insert -- - --;
Column  6, line 49, delete "accuring" and insert
--accruing--;
Column  7, line  3, delete "in" and insert --is--;
Column  7, line  4, delete "and" and insert --an--;
Column  7, line 25, after "body" insert --,--;
Column  7, line 28, delete "state" and insert --states--;
Column  7, line 34, delete "its" and insert --the--;
Column  8, line  2, delete "properities" and insert
--properties--;
```

UNITED STATES PATENT AND TRADEMARK OFFICE
CERTIFICATE OF CORRECTION

PATENT NO. : 4,409,605

DATED : October 11, 1983

INVENTOR(S) : Stanford R. Ovshinsky and Arun Madan

It is certified that error appears in the above-identified patent and that said Letters Patent is hereby corrected as shown below:

Column 8, line 10, delete "its" and insert --their--;
Column 8, line 29, after "devices" delete "and";
Column 9, line 11, after "$\sigma$" insert --(--;
Column 9, line 12, delete "($10^3$/T)" and insert --$\frac{10^3}{T}$--;
Column 10, line 24, after "cathode" insert --backing member 14--;
Column 10, line 45, after "material" insert --38--;
Column 11, line 1, delete "m torr" and insert --mtorr--;
Column 11, line 22, after "18" delete "," and insert --and/or--;
Column 12, line 23, delete "10 $^3$/T" and insert --$10^3$/T--;
Column 13, line 46, delete "occurs" and insert --occur--;
Column 13, line 60, delete "carbon" and insert --Carlson--;
Column 13, line 62, delete "staes" and insert --states--;
Column 14, line 1, delete " 10/1 " and insert --10/1--;
Column 14, line 21, delete "alterant" and insert --altering--;
Column 14, line 30, delete "alterant" and insert --altering--;
Column 14, line 68, delete "arsene" and insert --arsine--;
Column 15, line 4, delete "10 $^{-7}$" and insert --$10^{-7}$--;

UNITED STATES PATENT AND TRADEMARK OFFICE
CERTIFICATE OF CORRECTION

PATENT NO. : 4,409,605                                  Page 3 of 5

DATED      : October 11, 1983

INVENTOR(S): Stanford R. Ovshinsky and Arun Madan

It is certified that error appears in the above-identified patent and that said Letters Patent is hereby corrected as shown below:

```
Column 15, line 38, after "gap" insert --,--;
Column 15, line 66, delete "a" and insert --an--;
Column 16, line 41, delete "n⁻" and insert --n⁺--;
Column 16, line 60, delete "antireflection" and insert
--anti-reflection--;
Column 17, line 58, after "junction" delete ",";
Column 18, line  5, after "90" delete ",";
Column 18, line  5, after "heterojunction" delete ",";
Column 18, line 20, delete "eletrode" and insert
--electrode--;
Column 18, line 24, delete "92" and insert --92'--;
Column 18, line 30, delete "94a" and insert --94a'--;
Column 18, line 30, delete "92" and insert --92'--;
Column 18, line 40, delete "98'" and insert --98--;
Column 18, line 40, delete "antireflection" and insert
--anti-reflection--;
Column 18, line 41, delete "86" and insert --60--;
Column 18, line 42, delete "84" and insert --61--;
Column 18, line 42, delete "6" and insert --5--;
Column 18, line 52, delete "baseforming" and insert
--base-forming--;
Column 19, line 52, after "hydrogen" delete ", fluorine";
```

UNITED STATES PATENT AND TRADEMARK OFFICE
CERTIFICATE OF CORRECTION

PATENT NO. : 4,409,605

DATED : October 11, 1983

INVENTOR(S) : Stanford R. Ovshinsky and Arun Madan

It is certified that error appears in the above-identified patent and that said Letters Patent is hereby corrected as shown below:

Column 20, line 15, delete "elecronic" and insert --electronic--;
Column 20, line 43, delete "comprised" and insert --comprise--;
Column 20, line 60, after "defect" delete "of";
Column 21, line 34, delete "1" and insert --one--;
Column 22, line 31, delete "image producing" and insert --image-producing--;
Column 23, line 33, delete "semi-conductor" and insert --semiconductor--;
Column 24, line 2, delete "semi-conductor" and insert --semiconductor--;
Column 24, line 8, delete "semi-conductor" and insert --semiconductor--;
Column 24, line 12, delete "semi-conductor" and insert --semiconductor--;
Column 24, line 16, delete "semi-conductor" (first occurrence and insert --semiconductor--;
Column 24, lines 16-17, delete "semi-con-ductor" and insert --semicon-ductor--;

UNITED STATES PATENT AND TRADEMARK OFFICE
CERTIFICATE OF CORRECTION

PATENT NO. : 4,409,605                             Page 5 of 5

DATED     : October 11, 1983

INVENTOR(S) : Stanford R. Ovshinsky and Arun Madan

It is certified that error appears in the above-identified patent and that said Letters Patent is hereby corrected as shown below:

Column 24, line 19, delete "semi-conductor" and insert
--semiconductor--.

Signed and Sealed this

Twenty-fourth Day of February, 1987

Attest:

DONALD J. QUIGG

Attesting Officer

Commissioner of Patents and Trademarks